(12) United States Patent
Kim (10) Patent No.: US 12,027,392 B2
(45) Date of Patent: Jul. 2, 2024

(54) PUMP BACKSTREAM PREVENTION STRUCTURE FOR SEMICONDUCTOR FABRICATION EQUIPMENT

(71) Applicant: Tae Wha Kim, Gyeonggi-do (KR)

(72) Inventor: Tae Wha Kim, Gyeonggi-do (KR)

( * ) Notice: Subject to any disclaimer, the term of this patent is extended or adjusted under 35 U.S.C. 154(b) by 1040 days.

(21) Appl. No.: 16/958,082

(22) PCT Filed: Feb. 27, 2020

(86) PCT No.: PCT/KR2020/002786
§ 371 (c)(1),
(2) Date: Jun. 25, 2020

(87) PCT Pub. No.: WO2021/006453
PCT Pub. Date: Jan. 14, 2021

(65) Prior Publication Data
US 2023/0113357 A1   Apr. 13, 2023

(30) Foreign Application Priority Data
Jul. 5, 2019 (KR) .................. 10-2019-0081542

(51) Int. Cl.
*H01L 21/67* (2006.01)
*F04B 51/00* (2006.01)
(Continued)

(52) U.S. Cl.
CPC ........ *H01L 21/67253* (2013.01); *F04B 51/00* (2013.01); *F04D 15/0088* (2013.01);
(Continued)

(58) Field of Classification Search
CPC ......... H01L 21/67253; H01L 21/67242; F04D 19/04; F04D 15/0088; F04B 51/00; F04B 2203/0201
See application file for complete search history.

(56) References Cited

U.S. PATENT DOCUMENTS 3,922,110 A * 11/1975 Huse .................. F04B 9/02
60/431
4,241,644 A * 12/1980 Schertler .............. F16K 31/406
92/162 R
(Continued)

FOREIGN PATENT DOCUMENTS

KR      2003-0009790       2/2003
KR      10-2006-0020200    3/2006
(Continued)

OTHER PUBLICATIONS

Written Opinion of the International Searching Authority for PCT/KR2020/002786 issued on Jun. 4, 2020 and its English translation by Google Translate.
(Continued)

*Primary Examiner* — Atif H Chaudry
(74) *Attorney, Agent, or Firm* — Ladas & Parry, LLP (57) ABSTRACT

Provided is a pump backstream prevention structure for semiconductor fabrication equipment, including a sensor, an isolation air supply pipe, and a control unit. A time delay from a point in time at which the dry pump starts to malfunction to a point in time at which the isolation valve is closed is reduced, compared to a method of closing the isolation valve by a controller of the semiconductor fabrication equipment. Accordingly, a backstream in which particles move from the pumping pipe to the process chamber before the closing of the isolation valve is prevented.

13 Claims, 6 Drawing Sheets

(51) Int. Cl.
  *F04D 15/00*     (2006.01)
  *F04D 19/04*     (2006.01)
(52) U.S. Cl.
  CPC ........ *F04D 19/04* (2013.01); *H01L 21/67017*
           (2013.01); *F04B 2203/0201* (2013.01)

(56) References Cited

U.S. PATENT DOCUMENTS

| | | | | |
|---|---|---|---|---|
| 4,505,647 | A | * | 3/1985 | Alloca ................... F04B 37/14 |
| | | | | 417/252 |
| 2020/0201305 | A1 | * | 6/2020 | Yamamoto ....... G05B 19/41875 |

FOREIGN PATENT DOCUMENTS

| | | | |
|---|---|---|---|
| KR | 10-2007-0033114 | | 3/2007 |
| KR | 10-0962547 | | 6/2010 |
| KR | 10-1121597 | | 3/2012 |
| KR | 20170003274 U | * | 9/2017 |
| KR | 20-0484827 | | 10/2017 |
| KR | 10-2073789 | | 2/2020 |

OTHER PUBLICATIONS

International Search Report for PCT/KR2020/002786 issued on Jun. 4, 2020 and its English translation by Google Translate.

* cited by examiner

PUMP BACKSTREAM PREVENTION STRUCTURE FOR SEMICONDUCTOR FABRICATION EQUIPMENT

CROSS-REFERENCE TO RELATED APPLICATIONS

The present application is the U.S. National Phase of PCT Application No. PCT/KR2020/002786 filed on Feb. 27, 2020, which claims the priority to Korean Patent Application No. 10-2019-0081542 filed on Jul. 5, 2019, the entire contents of which are incorporated herein by reference.

TECHNICAL FIELD

The present disclosure relates to a pump backstream prevention structure for semiconductor fabrication equipment.

BACKGROUND ART

Semiconductor fabrication equipment is provided with process chambers in which related processes are performed. In a majority of the processes performed in the process chambers, the inside of the process chambers is in a vacuum state.

To vacuumize the inside of the process chamber, a turbo pump, a dry pump, and an isolation valve are disposed on a pumping pipe extending through the process chambers.

The turbo pump performs vacuum pumping by drawing gas from the process chambers through the pumping pipe communicating with the process chambers, so that the interior of the process chambers maintains a high degree of vacuum. The dry pump serves to assist in the vacuum pumping of the turbo pump. The isolation valve is disposed on the pumping pipe between the turbo pump and the dry pump to close the pumping pipe between the turbo pump and the dry pump.

When any pump, such as the dry pump or the turbo pump, operates normally, the isolation valve is opened. When any pump, such as the dry pump or the turbo pump, malfunctions, a backstream in which particles that have been discharged through the pumping pipe flow reversely into the process chamber may occur. When such a backstream occurs, the process chamber and a wafer accommodated within the process chamber and under the process may be contaminated by the particles. Accordingly, a structure for preventing backstreams is required.

A related-art example of the structure for preventing backstreams in a process chamber is disclosed in Korean Patent Application Publication No. 10-2003-0009790 (dated Feb. 5, 2003; titled "APPARATUS FOR PREVENTING BACKSTREAM OF PARTICLES IN SEMICONDUCTOR FABRICATION EQUIPMENT").

However, such a related-art structure for preventing backstreams in a process chamber, including the structure described in the above-referenced patent document, still has a problem as follows. When any malfunctioning pump, such as the dry pump or the turbo pump, is stopped and a pump malfunction signal is generated, the pump malfunction signal is transferred to a controller of semiconductor fabrication equipment, and the controller transmits a signal instructing the isolation valve to perform a closing operation. According to this structure, a time delay from a point in time at which the pump starts to malfunction to a point in time at which the isolation valve performs the closing operation is unavoidable. As a result, before the pumping pipe is closed by the isolation valve, a backstream of particles moving from the pump pipe into the process chamber may occur.

DISCLOSURE

Technical Problem

Accordingly, an objective of the present disclosure is to provide a pump backstream prevention structure for semiconductor fabrication equipment, the pump backstream prevention structure being able to reduce a time delay from a point in time at which the dry pump starts to malfunction to a point in time at which the isolation valve is closed may be reduced, compared to the method of closing the isolation valve by a controller of the semiconductor fabrication equipment, so that a backstream in which particles move from the pumping pipe to the process chamber before the closing of the isolation valve may be prevented.

Technical Solution

According to an aspect of the present disclosure, provided is a pump backstream prevention structure for semiconductor fabrication equipment comprising a process chamber in which a semiconductor fabrication process is performed, a pumping pipe extending from the process chamber, allowing the interior of the process chamber to be vacuumized therethrough, a turbo pump disposed on the pumping pipe to pump gas from the process chamber to vacuumize the interior of the process chamber, a dry pump disposed on the pumping pipe at a position further spaced apart from the process chamber than the turbo pump to assist in the vacuum pumping of the turbo pump, and an isolation valve disposed on the pumping pipe between the turbo pump and the dry pump to close a portion of the pumping pipe between the turbo pump and the dry pump. The pump backstream prevention structure may include: a sensor detecting, in real time, at least one of a detection current value for operation of the dry pump, a detection voltage value for operation of the dry pump, and the number of revolutions of a rotor of the dry pump; an isolation air supply pipe externally supplying air to the isolation valve so that the isolation valve remains in a position in which the pumping pipe is opened by the isolation valve; and a control unit controlling the isolation valve to open or close the pumping pipe by allowing the air flowing through the isolation air supply pipe to move to the isolation valve or blocking the air from moving to the isolation valve, in accordance with at least one of the detection current value for the operation of the dry pump, the detection voltage value for the operation of the dry pump, and the number of revolutions of the rotor of the dry pump.

Advantageous Effects

In the pump backstream prevention structure for semiconductor fabrication equipment according to an aspect of the present disclosure, the pump backstream prevention structure for semiconductor fabrication equipment includes the sensor, the isolation air supply pipe, and the control unit. A time delay from a point in time at which the dry pump starts to malfunction to a point in time at which the isolation valve is closed may be reduced, compared to the method of closing the isolation valve by a controller of the semiconductor fabrication equipment. Accordingly, a backstream in which particles move from the pumping pipe to the process chamber before the closing of the isolation valve may be prevented.

BEST MODE

Hereinafter, a pump backstream prevention structure for semiconductor fabrication equipment according to embodiments of the present disclosure will be described with reference to the accompanying drawings.

Figure 1:
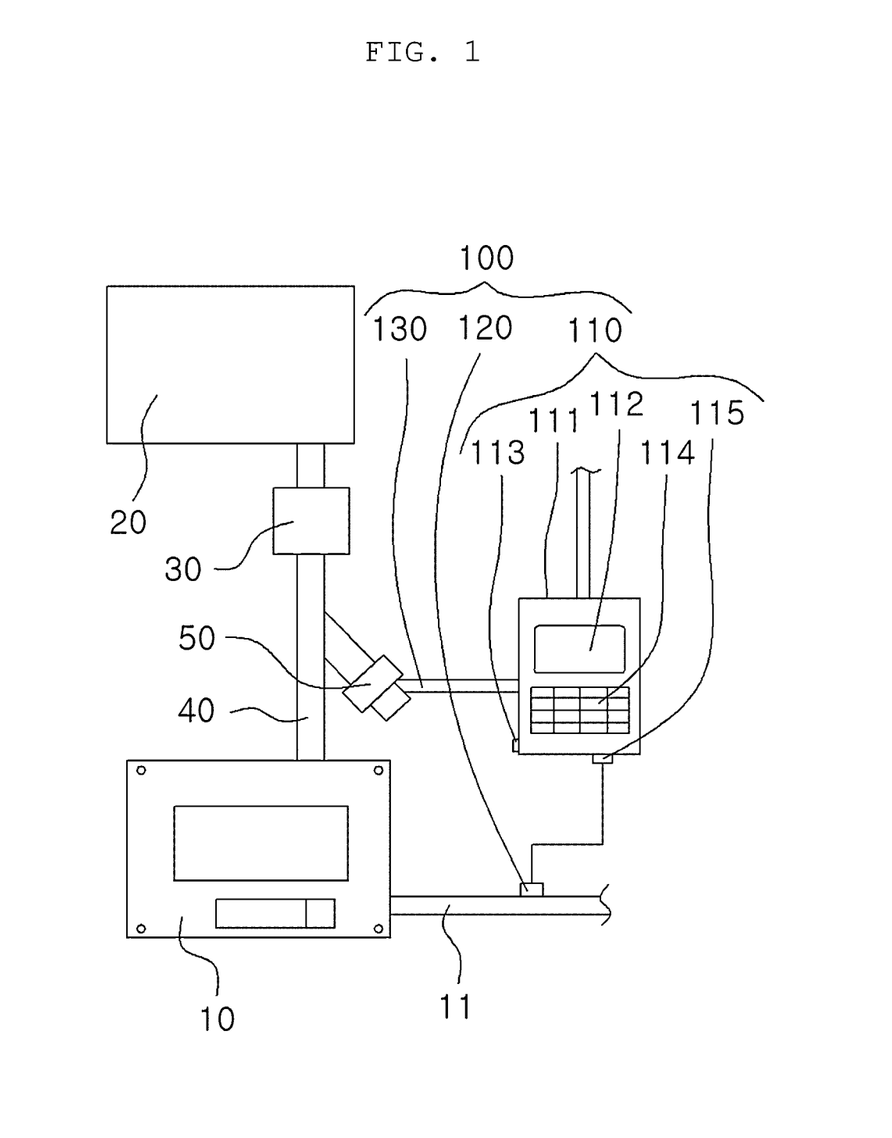
FIG. 1 illustrates a pump backstream prevention structure for semiconductor fabrication equipment according to a first embodiment of the present disclosure used in semiconductor fabrication equipment.
Figure 2:
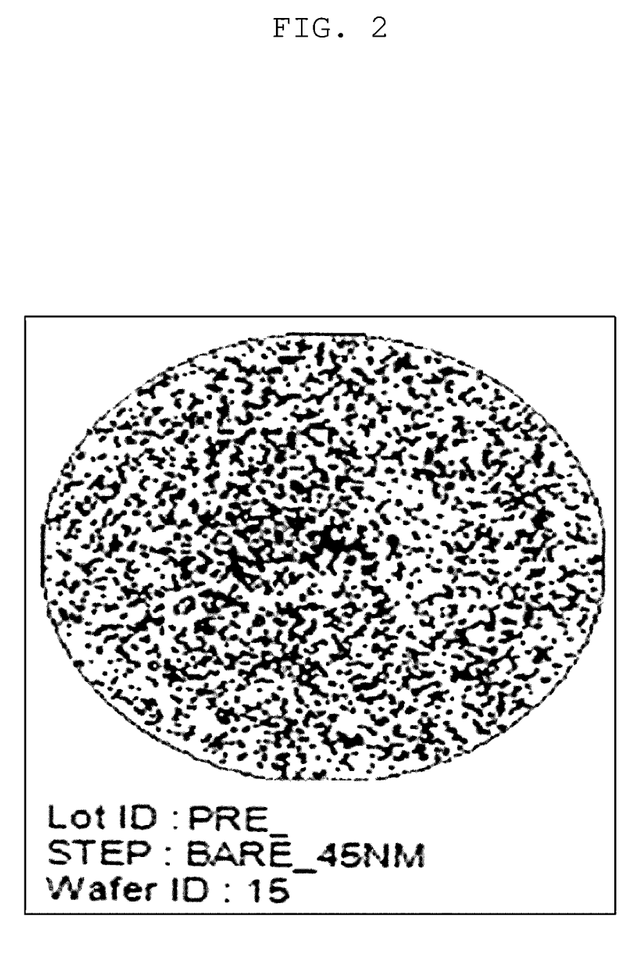
FIG. 2 is a print of an image captured from a wafer contaminated due to a backstream in a dry pump of related-art semiconductor fabrication equipment.
Figure 3:
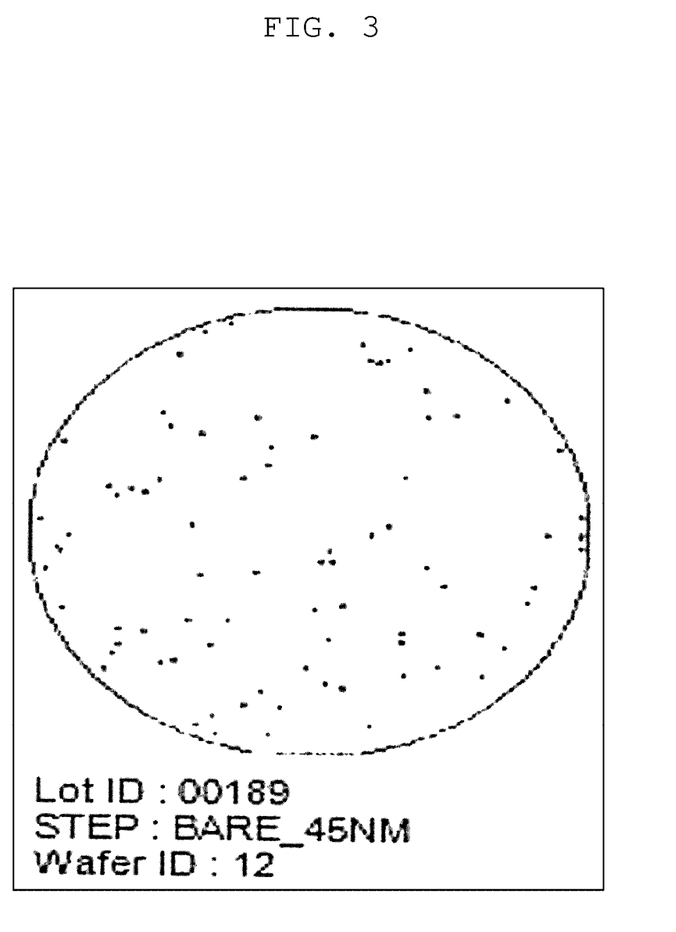
FIG. 3 is a print of an image captured from a wafer, the contamination of which is minimized, since a backstream is prevented by the pump backstream prevention structure for semiconductor fabrication equipment according to the first embodiment of the present disclosure.

FIG. 1 illustrates a pump backstream prevention structure for semiconductor fabrication equipment according to a first embodiment of the present disclosure used in semiconductor fabrication equipment, FIG. 2 is a print of an image captured from a wafer contaminated due to a backstream in a dry pump of related-art semiconductor fabrication equipment, and FIG. 3 is a print of an image captured from a wafer, the contamination of which is minimized, since a backstream is prevented by the pump backstream prevention structure for semiconductor fabrication equipment according to the first embodiment of the present disclosure.

Referring to FIGS. 1 to 3, the pump backstream prevention structure 100 for semiconductor fabrication equipment according to the first embodiment of the present disclosure is used in semiconductor fabrication equipment, and includes a sensor 120, an isolation air supply pipe 130, and a control unit 110.

The semiconductor fabrication equipment includes: a process chamber 20 in which a semiconductor fabrication process is performed; a pumping pipe 40 extending from the process chamber 20, allowing the interior of the process chamber 20 to be vacuumized therethrough; a turbo pump 30 disposed on the pumping pipe 40 to pump gas from the process chamber 20 to vacuumize the interior of the process chamber 20; a dry pump 10 disposed on the pumping pipe 40 at a position further spaced apart from the process chamber 20 than the turbo pump 30 to assist in the vacuum pumping of the turbo pump 30; and an isolation valve 50 disposed on the pumping pipe 40 between the turbo pump 30 and the dry pump 10 to close a portion of the pumping pipe 40 between the turbo pump 30 and the dry pump 10.

Since these components of the semiconductor fabrication equipment are well known in the art, detailed illustrations and descriptions thereof will be omitted.

The sensor 120 serves to detect, in real time, at least one of a detection current value for the operation of the dry pump 10, a detection voltage value for the operation of the dry pump 10, and the number of revolutions of a rotor of the dry pump 10.

The sensor 120 may detect a current by a variety of detection methods. Examples of such detection methods include a current transformer method of detecting a primary current by measuring a secondary current using a doughnut-shaped core on which primary and secondary coils are wound and a Hall sensor method of detecting the strength of a magnetic field, i.e. the strength of a current, by measuring a Hall voltage using a Hall element located in a magnetic field generated by the current.

In addition, the sensor 120 may detect a voltage by a method of monitoring, in real time, the voltage of a current supply cable 11 connected to the dry pump 10 and a ground voltage. Details of the current supply cable 11 will be described later.

The sensor 120 may detect the number of revolutions of the rotor of the dry pump 10 by a variety of methods, such as a method of directly detecting the number of revolutions of the rotor using a Hall sensor or the like.

According to the present embodiment, the sensor 120 is disposed on the current supply cable 11 extending from an external power source and connected to the dry pump 10 to supply electricity to the dry pump 10. The sensor 120 detects, in real time, at least one of the detection current value for the operation of the dry pump 10 and the detection voltage value for the operation of the dry pump 10. Then, at least one of the detection current value for the operation of the dry pump 10 and the detection voltage value for the operation of the dry pump 10 may be detected from the current supply cable 11 located upstream of the dry pump 10, so that a malfunctioning situation of the dry pump 10, such as a stopping of the dry pump 10, may be more rapidly detected.

According to the present embodiment, the sensor 120 detects at least one of the detection current value for the operation of the dry pump 10, the detection voltage value for the operation of the dry pump 10, and the number of revolutions of the rotor of the dry pump 10 in a period of 10 to 300 microseconds. Consequently, the malfunctioning situation of the dry pump 10, such as the stopping of the dry pump 10, may be more rapidly detected.

The isolation air supply pipe 130 serves to externally supply air to the isolation valve 50 so that the isolation valve 50 remains in a position in which the pumping pipe 40 is opened by the isolation valve 50.

In a situation in which air is being supplied to the isolation valve 50 through the isolation air supply pipe 130, the pumping pipe 40 remains opened by the isolation valve 50. In a situation in which the supply of air to the isolation valve 50 through the isolation air supply pipe 130 is stopped, the isolation valve 50 is in a position in which the pumping pipe 40 is closed by the isolation valve 50.

The control unit 110 controls the isolation valve 50 to open or close the pumping pipe 40 by allowing air flowing through the isolation air supply pipe 130 to move to the isolation valve 50 or blocking the air from moving to the isolation valve 50, in accordance with at least one of the detection current value for the operation of the dry pump 10, the detection voltage value for the operation of the dry pump 10, and the number of revolutions of the rotor of the dry pump 10.

According to the present embodiment, the control unit 110 receives, in real time, at least one of the detection current value for the operation of the dry pump 10 and the detection voltage value for the operation of the dry pump 10 detected by the sensor 120. When the supply of power to the dry pump 10 is stopped, the control unit 110 blocks, in real time, the supply of air to the isolation valve 50 through isolation air supply pipe 130 by receiving, in real time, a power supply off signal indicating that the supply of power to the dry pump 10 is stopped from the sensor 120. Consequently, the isolation valve 50 closes the pumping pipe 40 at the moment that the dry pump 10 is stopped.

Here, the power supply off signal indicating the stopping of the supply of power to the dry pump 10 is a signal indicating a change in a voltage value or a current value when the supply of power to the dry pump 10 is stopped due to a power failure, an internal defect of the pump, or the like. The power supply off signal may also be referred to as a signal indicating a stopping of the dry pump 10. The power supply off signal indicating the stopping of the supply of power to the dry pump 10 is detected by the sensor 120.

The control unit 110 includes a housing 111, a display 122, a power connector 113, an input unit 114, and a data cable connector 115. The housing 111 has a circuit provided on the internal portion thereof. The display 122 is provided on the surface of the housing 111 to display various pieces of information, such as the operating state of the control unit 110. The power connector 113 is provided on one portion of the housing 111 and connected to a power cable connected to an external power source. The input unit 114 is provided on the surface of the housing 111, in the shape of a keyboard. The input unit 114 allows various pieces of information to be input therethrough. The cable connector 115 is connected to the sensor 120 detecting, in real time, at least one of the detection current value for the operation of the dry pump 10, the detection voltage value for the operation of the dry pump 10, and the number of revolutions of the rotor of the dry pump 10 to obtain information detected by the sensor 120.

A battery is disposed inside the control unit 110 to prepare for a power supply, so that the isolation valve 50 may be reliably controlled to be closed even at a power failure.

In addition, a shutoff valve, such as a three-way valve, may be disposed inside the control unit 110. The shutoff valve may be disposed on the isolation air supply pipe 130, through which air is supplied to deliver the air to the isolation valve 50 from an external pump, to close the isolation air supply pipe 130. When the power supply off signal indicating the stopping of the supply of power to the dry pump 10 detected by the sensor 120 is received, the shutoff valve may operate to immediately stop the delivery of air from the external pump to the isolation valve 50.

Although the present embodiment has been described that the shutoff valve is a three-way valve as an example, the shutoff valve may be one of various types of valves capable of closing the air supply pipe through which air flows.

According to the present embodiment, the control unit 110 may be initially connected to the dry pump 10, and may categorize the model of the dry pump 10 by comparing at least one of the detection current value for the operation of the dry pump 10, the detection voltage value for the operation of the dry pump 10, and the number of revolutions of the rotor of the dry pump 10, detected by the sensor 120, with preset table values of the dry pump 10, i.e. unique values of various dry pump models previously stored, and thus, automatically recognize the model of the dry pump 10 to automatically and previously determine a condition value by which the dry pump 10 is stopped.

The control unit 110 retains the preset table values of the dry pump 10, i.e. previously stored unique values of various dry pump models. When the data cable connected to the dry pump 10 is initially connected to the data cable connector 115, at least one of the detection current value for the operation of the dry pump 10, the detection voltage value for the operation of the dry pump 10, and the number of revolutions of the rotor of the dry pump 10, detected by the sensor 120, may be transferred to the control unit 110 through the data cable connected to the data cable connector 115. The preset table values may be compared with at least one of the detection current value for the operation of the dry pump 10, the detection voltage value for the operation of the dry pump 10, and the number of revolutions of the rotor of the dry pump 10 transferred as above, so that the control unit 110 may automatically recognize the model of the dry pump 10.

The control unit 110 may select a unique stop condition value of the dry pump 10, the model of which is recognized from among the preset table values, to determine whether or not at least one of the detection current value for the operation of the dry pump 10, the detection voltage value for the operation of the dry pump 10, and the number of revolutions of the rotor of the dry pump 10, i.e. a signal value of the dry pump 10 transferred continuously and in real time through the data cable after detected by the sensor 120, has arrived at the stop condition value by which dry pump 10 is stopped.

If it is determined that at least one of the detection current value for the operation of the dry pump 10, the detection voltage value for the operation of the dry pump 10, and the number of revolutions of the rotor of the dry pump 10, i.e. the signal value of the dry pump 10, has arrived at a predetermined offset operation value, i.e. a value not arrived at the stop condition value by which the dry pump 10 is stopped, the control unit 110 transfers a close signal to the isolation valve 50 to close the pumping pipe 40.

For example, when the stop condition value of the dry pump 10 is 30A, at the moment that a signal value arrived at a predetermined offset operation value 29A, i.e. a value not arrived at the stop condition value by which the dry pump 10 is stopped, is detected by the sensor 120 and transferred to the control unit 110 from the dry pump 10, the control unit 110 transfers the close signal to the isolation valve 50.

When the close signal to the isolation valve 50 is transferred, the shutoff valve disposed inside the control unit 110 may be immediately closed to stop the supply of air supposed to be delivered to the isolation valve 50 through the isolation air supply pipe 130, so that the pumping pipe 40 connecting the dry pump 10 and the process chamber 20 may be immediately closed.

Images of results of particle backstream tests carried out using the pump backstream prevention structure 100 for semiconductor fabrication equipment according to the present embodiment as described above and a related-art structure for semiconductor fabrication equipment in which an AGV is used in the dry pump 10 are illustrated in FIGS. 2 and 3.

Referring to FIG. 2, it may be appreciated that a semiconductor wafer was contaminated by a large amount of backstreamed particles, since the backstream of particles was not properly prevented by the related-art closing driving of the AGV in an emergency, such as a power failure or an internal defect of the pump.

In contrast, referring to FIG. 3, it may be appreciated that the contamination of a semiconductor wafer was minimized, since the backstream of particles was effectively prevented by the closing driving of the pump backstream prevention structure 100 for semiconductor fabrication equipment according to the present embodiment in an emergency, such as a power failure or an internal defect of the pump, whereby substantially no particles were backstreamed to the semiconductor wafer.

P4 model available from KLA-Tencor Corporation was used in the tests of FIGS. 2 and 3, and DPS-2 model available from Applied Materials, Inc. was used as test equipment by way of example.

Hereinafter, the operation of the pump backstream prevention structure 100 for semiconductor fabrication equipment according to the present embodiment will be described with reference to the drawing.

First, if any one detected by the sensor 120 and transferred to the control unit 110, among the detection current value for the operation of the dry pump 10, the detection voltage value for the operation of the dry pump 10, and the number of revolutions of the rotor of the dry pump 10, is equal to or greater than a preset reference value, the control unit 110 determines that the dry pump 10 is operating normally. In this case, the isolation valve 50 remains in the position in which the pumping pipe 40 is opened by the isolation valve 50.

In contrast, if at least one of the detection current value for the operation of the dry pump 10, the detection voltage value for the operation of the dry pump 10, and the number of revolutions of the rotor of the dry pump 10, detected by the sensor 120 and transferred to the control unit 110, is less than the preset reference value or the supply of power to the dry pump 10 is stopped, the control unit 110 determines that the dry pump 10 is malfunctioning. In this case, air flowing through the isolation air supply pipe 130 is blocked from moving to the isolation valve 50, so that the isolation valve 50 closes the pumping pipe 40 in real time.

Since the pump backstream prevention structure 100 for semiconductor fabrication equipment includes the sensor 120, the isolation air supply pipe, and the control unit 110 as described above, when a malfunctioning situation of the dry pump 10, in which the dry pump 10 is stopped due to a power failure, an internal defect, or the like, occurs, a time delay from a point in time at which the dry pump 10 starts to malfunction to a point in time at which the isolation valve 50 is closed may be reduced, compared to the method of closing the isolation valve 50 by a controller of the semiconductor fabrication equipment. Consequently, a backstream in which particles move from the pumping pipe 40 to the process chamber 20 before the closing of the isolation valve 50 may be prevented, thereby preventing a semiconductor wafer within the process chamber 20 from being contaminated. Accordingly, an operation, such as cleaning of the process chamber 20, resulting from the contamination caused by particles may not be required, and the turbo pump 30 may be prevented from an excessive load due to the backstream.

MODE FOR INVENTION

Hereinafter, a pump backstream prevention structure for semiconductor fabrication equipment according to another embodiment of the present disclosure will be described with reference to the accompanying drawings. In the following, descriptions of some features will be omitted when they are identical to those of the above-described first embodiment of the present disclosure.

Figure 4:
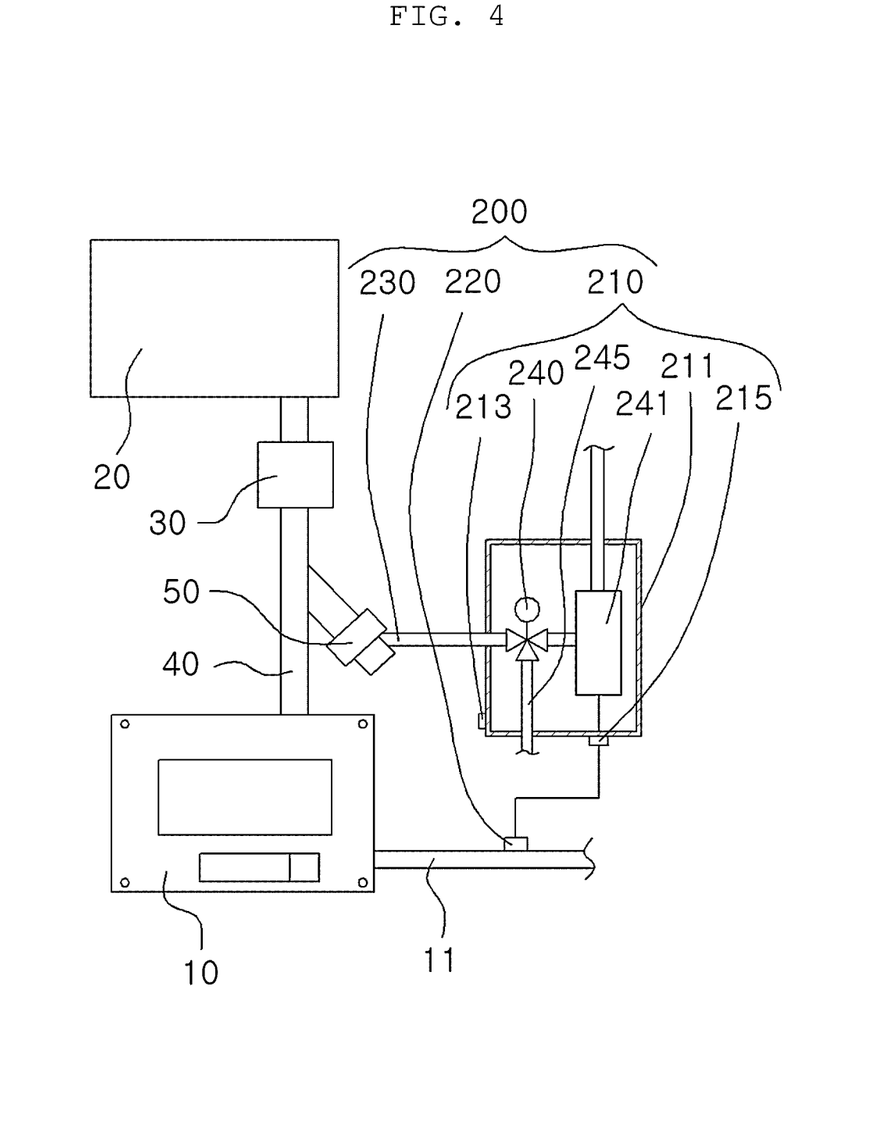
FIG. 4 illustrates an example in which a pump backstream prevention structure for semiconductor fabrication equipment according to a second embodiment of the present disclosure is used in semiconductor fabrication equipment.
Figure 5:
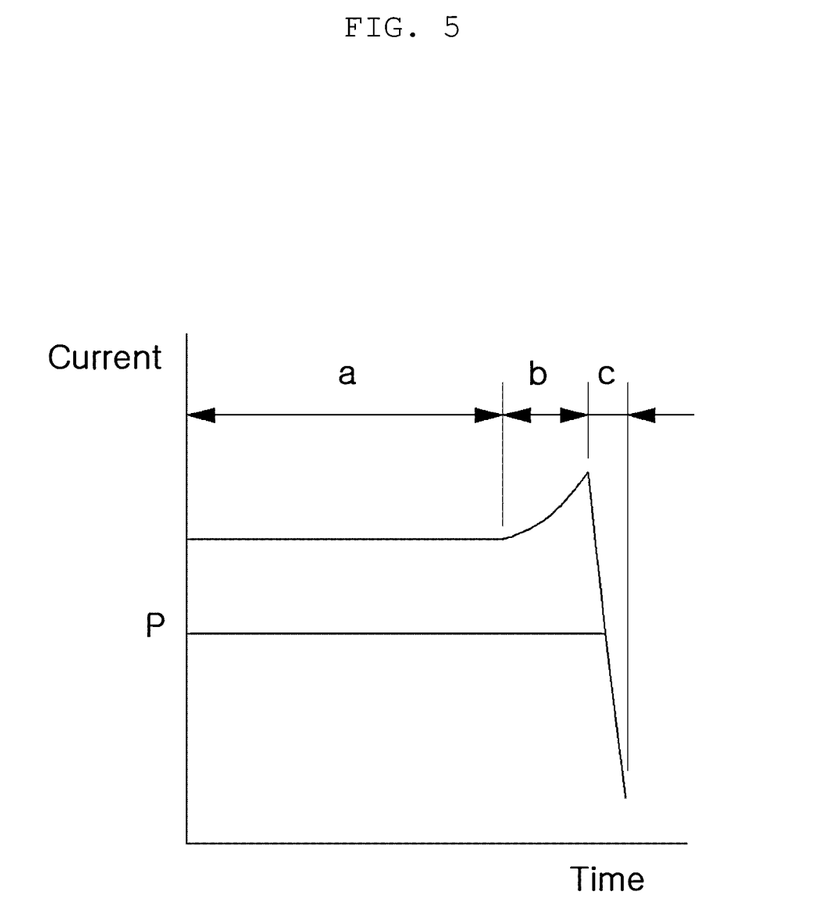
FIG. 5 is a graph illustrating an operating condition of the pump backstream prevention structure for semiconductor fabrication equipment according to the second embodiment of the present disclosure.

FIG. 4 illustrates an example in which a pump backstream prevention structure for semiconductor fabrication equipment according to a second embodiment of the present disclosure is used in semiconductor fabrication equipment, and FIG. 5 is a graph illustrating an operating condition of the pump backstream prevention structure for semiconductor fabrication equipment according to the second embodiment of the present disclosure.

Referring to FIGS. 4 and 5, the pump backstream prevention structure 200 for semiconductor fabrication equipment according to the present embodiment includes a sensor 220, an isolation air supply pipe 230, and a control unit 210.

The sensor 220 serves to detect, in real time, at least one of a detection current value for the operation of the dry pump 10, a detection voltage value for the operation of the dry pump 10, and the number of revolutions of the rotor of the dry pump 10.

The isolation air supply pipe 230 serves to externally supply air to the isolation valve 50 so that the isolation valve 50 remains in a position in which the pumping pipe 40 is opened by the isolation valve 50.

The control unit 210 controls the isolation valve 50 to open or close the pumping pipe 40 by allowing air flowing through the isolation air supply pipe 230 to move to the isolation valve 50 or blocking the air from moving to the isolation valve 50, in accordance with at least one of the detection current value for the operation of the dry pump 10, the detection voltage value for the operation of the dry pump 10, and the number of revolutions of the rotor of the dry pump 10.

The control unit according to the present embodiment includes a housing 211, a display, a power connector 213, an input unit, a data cable connector 215, a three-way valve 240, and a three-way controller 241.

The three-way valve 240 allows fluid to flow in two directions among three directions thereof while blocking fluid from flowing in the remaining direction among the three directions thereof. The three-way valve 240 is disposed on the isolation air supply pipe 230. Two ports of the three-way valve 240 are connected to the isolation air supply pipe 230, and a bypass vent line 245 extends from the remaining port of the three-way valve 240.

When the three-way valve 240 opens the two ports connected to the isolation air supply pipe 230, the port of the three-way valve 240 from which bypass vent line 245 extends is closed. When the three-way valve 240 closes the port connected to the isolation valve 50 of the two ports of the three-way valve 240 connected to the isolation air supply pipe 230, the port of the three-way valve 240 from which the bypass vent line 245 extends is opened.

The three-way valve 240 is electrically connected to the three-way controller 241, such that the operation thereof is controlled by the three-way controller 241.

The three-way controller 241 may receive, in real time, at least one of the detection current value for the operation of the dry pump 10, the detection voltage value for the operation of the dry pump 10, and the number of revolutions of the rotor of the dry pump 10, detected by the sensor 220, to control the three-way valve 240 in accordance with at least one of the detection current value for the operation of the dry pump 10, the detection voltage value for the operation of the dry pump 10, and the number of revolutions of the rotor of the dry pump 10 detected by the sensor 220.

Hereinafter, the operation of the pump backstream prevention structure 200 for semiconductor fabrication equipment according to the present embodiment will be described with reference to the drawings.

First, if any one detected by the sensor 220 and transferred to the three-way controller 241, among the detection current value for the operation of the dry pump 10, the detection voltage value for the operation of the dry pump 10, and the number of revolutions of the rotor of the dry pump 10, is equal to or greater than a preset reference value P, the three-way controller 241 determines that the dry pump 10 operates normally. In this case, the three-way controller 241 opens the ports of the three-way valve 240 connected to the isolation air supply pipe 230 and closes the port of the three-way valve 240 connected to the bypass vent line 245. Then, the air supplied externally and flowing through the isolation air supply pipe 230 is supplied to the isolation valve 50, so that the isolation valve 50 remains in the position in which the pumping pipe 40 is opened by the isolation valve 50.

In contrast, if at least one of the detection current value for the operation of the dry pump 10, the detection voltage value for the operation of the dry pump 10, and the number of revolutions of the rotor of the dry pump 10, detected by the sensor 220 and transferred to the three-way controller 241, is smaller than the preset reference value P, the three-way controller 241 determines that the dry pump 10 is malfunctioning. In this case, the three-way controller 241 closes the port connected to the isolation valve 50 of the ports of the three-way valve 240 connected to the isolation air supply pipe 230 while opening the port of the three-way valve 240 connected to the bypass vent line 245. Then, the air supplied externally and flowing through the isolation air supply pipe 230 is discharged outward through the bypass vent line 245 to prevent the air supplied externally and flowing through the isolation air supply pipe 230 from moving to the isolation valve 50, so that the isolation valve 50 closes the pumping pipe 40 in real time.

According to the present embodiment, as illustrated in FIG. 5, at least one of the detection current value for the operation of the dry pump 10 and the detection voltage value for the operation of the dry pump 10 has a sequential pattern of a stable state a within a predetermined range, an abnormal increase b to a predetermined level from the stable state a, and a sharp decrease c. Here, the three-way controller 241 determines whether or not at least one of the detection current value for the operation of the dry pump 10 and the detection voltage value for the operation of the dry pump 10 is smaller than the preset reference value P during the abnormal increase b to the predetermined level from the stable state a and the sharp decrease c of at least one of the detection current value for the operation of the dry pump 10 and the detection voltage value for the operation of the dry pump 10. Then, when a current value and a voltage value are taken during the abnormal increase b to the predetermined level from the stable state a, the isolation valve 50 may unnecessarily close the pumping pipe 40 even when at least one of the detection current value for the operation of the dry pump 10 and the detection voltage value for the operation of the dry pump 10 does not exhibit the sharp decrease c after the abnormal increase b. The isolation valve 50 may close the pumping pipe 40 only when the isolation valve 50 is required to close the pumping pipe 40 as at least one of the detection current value for the operation of the dry pump 10 and the detection voltage value for the operation of the dry pump 10 exhibits the sharp decrease c after the abnormal increase b.

Here, the preset reference value may be preset to be a current value and a voltage value smaller than a current value and a voltage value in the stable state a by predetermined levels. For example, the preset reference value may be preset to be a current value and a voltage value that are 70% of the current value and the voltage value in the stable state a, respectively.

As described above, the pump backstream prevention structure 200 for semiconductor fabrication equipment includes the sensor 220, the isolation air supply pipe 230, and the control unit 210. Accordingly, if at least one of the detection current value for the operation of the dry pump 10, the detection voltage value for the operation of the dry pump 10, and the number of revolutions of the rotor of the dry pump 10, detected by the sensor 220, is smaller than the preset reference value P, the three-way controller 241 may determine that the dry pump 10 is malfunctioning. In this case, the air supplied externally and flowing through the isolation air supply pipe 230 is discharged outward through the bypass vent line 245 while being blocked from moving to the isolation valve 50, so that the isolation valve 50 closes the pumping pipe 40. Consequently, the isolation valve 50 may close the pumping pipe 40 by a method of stopping the supply of air using the three-way valve 240 in accordance with at least one of the detection current value for the operation of the dry pump 10, the detection voltage value for the operation of the dry pump 10, and the number of revolutions of the rotor of the dry pump 10. Accordingly, a time delay from a point in time at which the dry pump 10 starts to malfunction to a point in time at which the isolation valve 50 is closed may be reduced, compared to the method of closing the isolation valve 50 by the controller of the semiconductor fabrication equipment, so that a backstream in which particles move from the pumping pipe 40 to the process chamber 20 before the closing of the isolation valve 50 may be prevented.

Hereinafter, a pump backstream prevention structure for semiconductor fabrication equipment according to another embodiment of the present disclosure will be described with reference to the accompanying drawings. In the following, descriptions of some features will be omitted when they are identical to those of the above-described first or second embodiment of the present disclosure.

Figure 6:
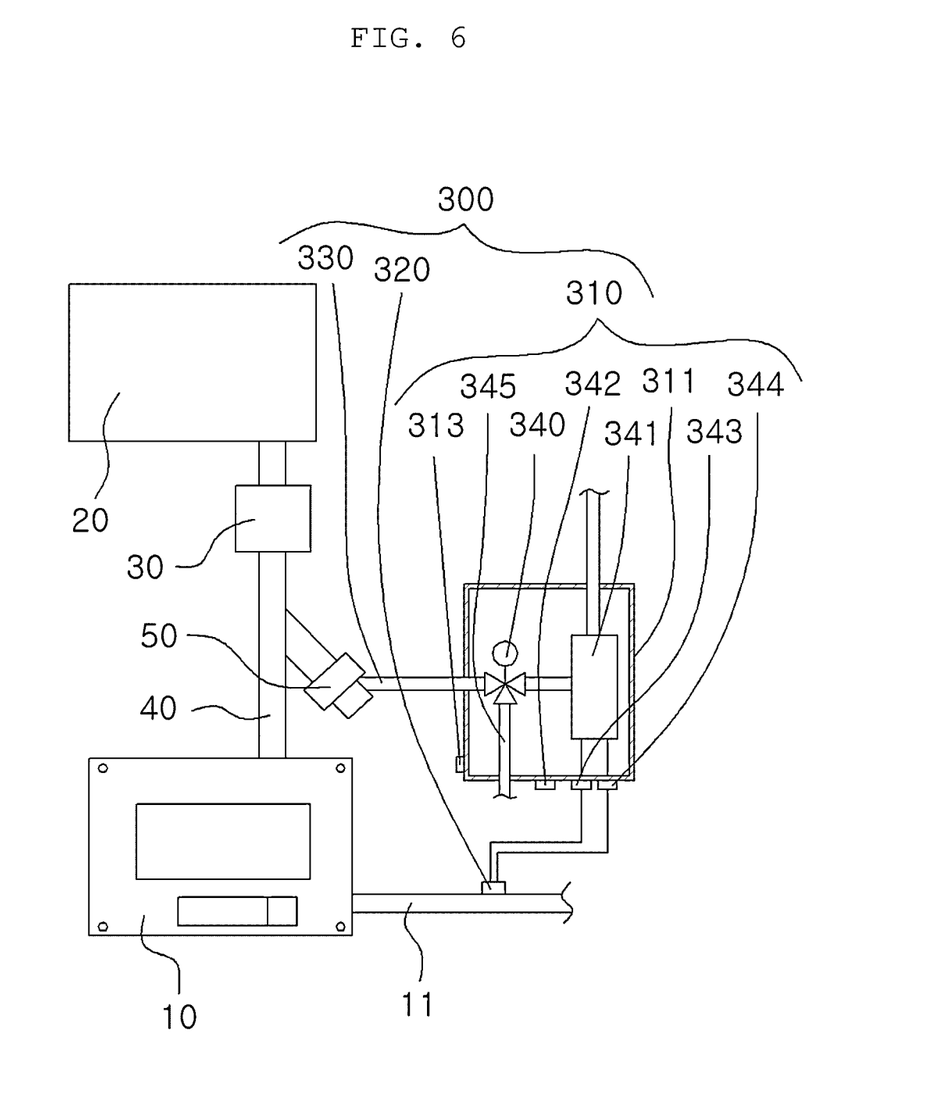
FIG. 6 illustrates an example in which a pump backstream prevention structure for semiconductor fabrication equipment according to a third embodiment of the present disclosure is used in semiconductor fabrication equipment.

FIG. 6 illustrates an example in which a pump backstream prevention structure for semiconductor fabrication equipment according to a third embodiment of the present disclosure is used in semiconductor fabrication equipment.

Referring to FIG. 6, the pump backstream prevention structure 300 for semiconductor fabrication equipment according to the present embodiment includes a sensor 320, an isolation air supply pipe 330, and a control unit 310.

The sensor 320 serves to detect, in real time, at least one of a detection current value for the operation of the dry pump 10, a detection voltage value for the operation of the dry pump 10, and the number of revolutions of the rotor of the dry pump 10.

The isolation air supply pipe 230 serves to externally supply air to the isolation valve 50 so that the isolation valve 50 remains in a position in which the pumping pipe 40 is opened by the isolation valve 50.

The control unit 310 controls the isolation valve 50 to open or close the pumping pipe 40 by allowing air flowing through the isolation air supply pipe 330 to move to the isolation valve 50 or blocking the air from moving to the isolation valve 50, in accordance with at least one of the detection current value for the operation of the dry pump 10, the detection voltage value for the operation of the dry pump 10, and the number of revolutions of the rotor of the dry pump 10.

According to the present embodiment, the control unit 310 includes a housing 311, a display, a power connector 313, an input unit, a three-way valve 340, a three-way controller 341, an adjustment switch 342, a detected current value transmitter 343, and a detected voltage value transmitter 344.

Two ports of the three-way valve 340 are connected to the isolation air supply pipe 330, and a bypass vent line extends from the remaining port of the three-way valve 340.

The three-way controller 341 may receive, in real time, at least one of the detection current value for the operation of the dry pump 10, the detection voltage value for the operation of the dry pump 10, and the number of revolutions of the rotor of the dry pump 10 detected by the sensor 320, and may control the three-way valve 340 in accordance with at least one of the detection current value for the operation of the dry pump 10, the detection voltage value for the operation of the dry pump 10, and the number of revolutions of the rotor of the dry pump 10 detected by the sensor 320.

The adjustment switch 342 may select detection information transferred to the control unit 310 from among the detection current value for the operation of the dry pump 10, the detection voltage value for the operation of the dry pump 10, and the number of revolutions of the rotor of the dry pump 10 detected by the sensor 320, and may set a step condition under which the operation of the dry pump 10 is stopped.

More specifically, the adjustment switch 342 includes a plurality of buttons or the like. The adjustment switch 342 may adjust a malfunctioning condition of the dry pump 10 by selecting a value from among the detection current value for the operation of the dry pump 10, the detection voltage value for the operation of the dry pump 10, and the number of revolutions of the rotor of the dry pump 10, and then, adjusting a ratio value by which the value, selected from among the detection current value for the operation of the dry pump 10, the detection voltage value for the operation of the dry pump 10, and the number of revolutions of the rotor of the dry pump 10, is smaller than a preset reference value.

For example, in a situation in which the preset current value for the operation of the dry pump 10 is 10A, the detection current value may be selected using the adjustment switch 342, and then, 50% of the preset reference value may be selected. In this case, the control unit 310 receives the current value from the sensor 320. If the current value received from the sensor 320 is 5A, i.e. 50% of the 10A, the control unit 310, more particularly, the three-way controller 341 may determine that the dry pump 10 is malfunctioning. Consequently, the three-way controller 341 closes the port of three-way valve 340 connected to the isolation valve 50 from among two ports of the three-way valve 340 connected to the isolation air supply pipe 330 while opening the port of the three-way valve 340 connected to the bypass line.

According to the present embodiment, the adjustment switch 342 may freely adjust the ratio smaller than the preset reference value within the range of 0 to 100%.

In addition, according to the present embodiment, the adjustment switch 342 may further include a data collecting function of calculating an average valve by collecting one of the detection current value for the operation of the dry pump 10, the detection voltage value for the operation of the dry pump 10, and the number of revolutions of the rotor of the dry pump 10 to review the detection current value for the operation of the dry pump 10, the detection voltage value for the operation of the dry pump 10, and the number of revolutions of the rotor of the dry pump 10 actually supplied to the dry pump 10.

In a situation in which the detection current value for the operation of the dry pump 10 is selected by the adjustment switch 342, the detected current value transmitter 343 receives the detection current value for the operation of the dry pump from the sensor 320 and transfers the detection current value for the operation of the dry pump to the three-way controller 341.

In a situation in which the voltage value for the operation of the dry pump 10 is selected by the adjustment switch 342, the detected voltage value transmitter 344 receives the voltage value for the operation of the dry pump 10 from the sensor 320 and transfers the voltage value for the operation of the dry pump 10 to the three-way controller 341.

Since the control unit 310 has the above-described configuration, the control unit 310 may easily select one from among the detection current value for the operation of the dry pump 10, the detection voltage value for the operation of the dry pump 10, and the number of revolutions of the rotor of the dry pump 10 transferred from the sensor 320, and may freely adjust the reference regarding the malfunctioning of the dry pump 10.

While the present disclosure has been illustrated and described with respect to the specific exemplary embodiments, it will be apparent to those having ordinary skill in the art that many modifications and variations are possible without departing from spirits and scopes of the present disclosure defined by appended claims. It is definitely noted that such modifications and variations are included within the scope of the present disclosure.

INDUSTRIAL APPLICABILITY

In the pump backstream prevention structure for semiconductor fabrication equipment according to an aspect of the present disclosure, a time delay from a point in time at which the dry pump starts to malfunction to a point in time at which the isolation valve is closed may be reduced, compared to the method of closing the isolation valve by the controller of the semiconductor fabrication equipment. Accordingly, a backstream in which particles move from the pumping pipe to the process chamber before the closing of the isolation valve may be prevented. Therefore, the present disclosure is regarded as having high industrial applicability.

The invention claimed is:

1. A pump backstream prevention structure for semiconductor fabrication equipment comprising a process chamber in which a semiconductor fabrication process is performed, a pumping pipe extending from the process chamber, allowing the interior of the process chamber to be vacuumized therethrough, a turbo pump disposed on the pumping pipe to pump gas from the process chamber to vacuumize the interior of the process chamber, a dry pump disposed on the pumping pipe at a position further spaced apart from the process chamber than the turbo pump to assist in the vacuum pumping of the turbo pump, and an isolation valve disposed on the pumping pipe between the turbo pump and the dry pump to close a portion of the pumping pipe between the turbo pump and the dry pump, the pump backstream prevention structure comprising:

a sensor detecting, in real time, at least one of a detection current value for operation of the dry pump, a detection voltage value for operation of the dry pump, and the number of revolutions of a rotor of the dry pump;

an isolation air supply pipe externally supplying air to the isolation valve so that the isolation valve remains in a position in which the pumping pipe is opened by the isolation valve;

a control unit controlling the isolation valve to open or close the pumping pipe by allowing the air flowing through the isolation air supply pipe to move to the isolation valve or blocking the air from moving to the isolation valve, in accordance with at least one of the detection current value for the operation of the dry pump, the detection voltage value for the operation of the dry pump, and the number of revolutions of the rotor of the dry pump; and an adjustment switch configured to select detection information transferred to the control unit from among the detection current value for the operation of the dry pump, the detection voltage value for the operation of the dry pump, and the number of revolutions of the rotor of the dry pump detected by the sensor, and set a step condition under which the operation of the dry pump is stopped based on the selected detection information.

2. The pump backstream prevention structure according to claim 1, wherein the sensor is disposed on a current supply cable extending from an external power source and connected to the dry pump to supply electricity to the dry pump, such that the sensor detects, in real time, at least one of the detection current value for the operation of the dry pump and the detection voltage value for the operation of the dry pump.

3. The pump backstream prevention structure according to claim 2, wherein, when the supply of power to the dry pump is stopped, the control unit blocks, in real time, the supply of the air to the isolation valve through isolation air supply pipe by receiving, in real time, a power supply off signal indicating that the supply of power to the dry pump 10 is stopped from the sensor, so that the isolation valve closes the pumping pipe at a moment that the dry pump is stopped.

4. The pump backstream prevention structure according to claim 1, wherein, when the dry pump is initially connected, the control unit categorizes models of the dry pump by comparing at least one of the detection current value for the operation of the dry pump, the detection voltage value for the operation of the dry pump, and the number of revolutions of the rotor of the dry pump, detected by the sensor, with preset table values of the dry pump or unique values of various dry pump models previously stored, and thus, automatically recognizes the model of the dry pump to automatically and previously determine a condition value by which the dry pump is stopped.

5. The pump backstream prevention structure according to claim 4, wherein, if it is determined that at least one of the detection current value for the operation of the dry pump, the detection voltage value for the operation of the dry pump, and the number of revolutions of the rotor of the dry pump has arrived at a predetermined offset operation value which is a value not arrived at the stop condition value by which the dry pump is stopped, the control unit transfers a close signal to the isolation valve to close the pumping pipe.

6. The pump backstream prevention structure according to claim 1, wherein the sensor detects at least one of the detection current value for the operation of the dry pump, the detection voltage value for the operation of the dry pump, and the number of revolutions of the rotor of the dry pump in a period of 10 to 300 microseconds.

7. The pump backstream prevention structure according to claim 1, wherein the control unit includes:

a three-way valve, with two ports of the three-way valve being connected to the isolation air supply pipe, and a bypass vent line extending from a remaining port of the three-way valve; and a three-way controller controlling the three-way valve in accordance with at least one from among the detection current value for the operation of the dry pump, the detection voltage value for the operation of the dry pump, and the number of revolutions of the rotor of the dry pump detected by the sensor, wherein the three-way controller is configured to, if determining that the dry pump is operating normally as at least one among the detection current value for the operation of the dry pump, the detection voltage value for the operation of the dry pump, and the number of revolutions of the rotor of the dry pump is equal to or greater than the preset reference value, open the two ports of the three-way valve connected to the isolation air supply pipe and close the remaining port of the three-way valve connected to the bypass vent line such that the air supplied from the outside of the pump backstream prevention structure through the isolation air supply pipe is supplied to the isolation valve, so that the isolation valve remains in the position in which the pumping pipe is opened by the isolation valve, if the three-way controller determines that the dry pump is malfunctioning as at least one detected by the sensor, among the detection current value for the operation of the dry pump, the detection voltage value for the operation of the dry pump, and the number of revolutions of the rotor of the dry pump, is smaller than the preset reference value, the three-way controller closes one port of the three-way valve connected to the isolation valve among the ports of the three-way valve connected to the isolation air supply pipe and opens the port of the three-way valve connected to the bypass vent line, so that the air supplied externally and flowing through the isolation air supply pipe is discharged outward through the bypass vent line so as to be blocked from moving to the isolation valve, whereby the isolation valve closes the pumping pipe.

8. The pump backstream prevention structure according to claim 7, wherein the three-way controller is configured to, when at least one of the detection current value for the operation of the dry pump and the detection voltage value for the operation of the dry pump has a sequential pattern of a stable state within a predetermined range, an abnormal increase to a predetermined level from the stable state, and a sharp decrease, determine whether or not at least one of the detection current value for the operation of the dry pump and the detection voltage value for the operation of the dry pump is smaller than the preset reference value during the abnormal increase to the predetermined level from the stable state and the sharp decrease of at least one of the detection current value for the operation of the dry pump and the detection voltage value for the operation of the dry pump.

9. The pump backstream prevention structure according to claim 1, wherein the control unit comprises a case, wherein the three-way valve and the three-way controller are disposed inside the case of the control unit.

10. The pump backstream prevention structure according to claim 1, wherein the adjustment switch includes a plurality of buttons.

11. The pump backstream prevention structure according to claim 1, wherein the adjustment switch is configured to adjust a malfunctioning condition of the dry pump by selecting a value from among the detection current value for the operation of the dry pump, the detection voltage value for the operation of the dry pump, and the number of revolutions of the rotor of the dry pump, and adjust a ratio value by which the value, selected from among the detection current value for the operation of the dry pump, the detection voltage value for the operation of the dry pump, and the number of revolutions of the rotor of the dry pump, is smaller than a preset reference value.

12. The pump backstream prevention structure according to claim 1, wherein the adjustment switch is configured to variably adjust a ratio smaller than the preset reference value within a range of 0 to 100%.

13. The pump backstream prevention structure according to claim 1, wherein the control unit includes:
  a three-way valve, wherein two ports of the three-way valve are connected to the isolation air supply pipe, and a remaining port of the three-way valve is connected to a bypass vent line; and
  a three-way controller configured to control the three-way valve based on at least one among the detection current value for the operation of the dry pump, the detection voltage value for the operation of the dry pump, and the number of revolutions of the rotor of the dry pump detected by the sensor, and
  wherein the three-way controller is further configured to, if determining that the dry pump is malfunctioning as at least one among the detection current value for the operation of the dry pump, the detection voltage value for the operation of the dry pump, and the number of revolutions of the rotor of the dry pump is smaller than a preset reference value, close one port connected to the isolation valve among the two ports of the three-way valve coupled to the isolation air supply pipe, and open another port not coupled to the isolation valve among the two ports of the three-way valve connected to the isolation air supply pipe and the remaining port connected to the bypass vent line, so that the air supplied from an outside of the pump backstream prevention structure through the isolation air supply pipe and is discharged through the bypass vent line to the outside of the pump backstream prevention structure through the another port not coupled to the isolation valve among the two ports of the three-way valve connected to the isolation air supply pipe and the remaining port connected to the bypass vent line.

* * * * *